United States Patent
Jung

[19]

[11] Patent Number: 6,137,742
[45] Date of Patent: Oct. 24, 2000

[54] SEMICONDUCTOR MEMORY DEVICE HAVING SELF-REFRESH CONTROL CIRCUIT

[75] Inventor: Woong-Sik Jung, Seoul, Rep. of Korea

[73] Assignee: Hyundai Electronics Industries Co., Ltd., Ichon-shi, Rep. of Korea

[21] Appl. No.: 09/386,156

[22] Filed: Aug. 31, 1999

[30] Foreign Application Priority Data

Oct. 14, 1998 [KR] Rep. of Korea ................... 42977/1998

[51] Int. Cl.[7] .................................................. G11C 7/00
[52] U.S. Cl. ............................................................ 365/222
[58] Field of Search ............................. 365/222, 230.03, 365/230.06

[56] References Cited

U.S. PATENT DOCUMENTS 5,631,872  5/1997  Naritake et al. ......................... 365/222
5,748,547  5/1998  Shau ........................................ 365/222

Primary Examiner—Tan T. Nguyen
Attorney, Agent, or Firm—Fleshner & Kim, LLP

[57] ABSTRACT

The present invention relates to a semiconductor memory device having a self-refresh control circuit. A conventional semiconductor memory device having a structure of a plurality of banks applies high-voltage word line driving signals individually to the banks in the self-refresh operation, which results in increased power consumption. According to the present invention, a semiconductor memory device having a self-refresh control circuit consists of a plurality of banks receiving word line driving signals and connected with a plurality of global word lines, a high voltage word line driving signal applied to the bank which is being refreshed being charge-shared with the bank to be succeedingly refreshed by a MOS transistor switched by a control signal. Accordingly, the high voltage word line driving signals individually applied to the plurality of banks are charge-shared by the bank to be succeedingly refreshed, and applied, thereby remarkably reducing the power consumption.

3 Claims, 4 Drawing Sheets

SEMICONDUCTOR MEMORY DEVICE HAVING SELF-REFRESH CONTROL CIRCUIT

BACKGROUND OF THE INVENTION

1. Field of the Invention

The present invention relates to a semiconductor memory device having a self-refresh control circuit, and in particular to a semiconductor memory device having a self-refresh control circuit which can considerably reduce power consumption of word lines.

2. Description of the Background Art

FIG. 1 is a block diagram illustrating a semiconductor memory device having a conventional self-refresh control circuit. As shown therein, the semiconductor memory device having the self-refresh control circuit includes: a first to the n-th banks BANK0~BANKn consisting of a plurality of memory array blocks including a memory cell array, a sub-word line driving circuit and a sense amplifier; and a first to the n-th global word lines GWL0~GWLn receiving a first to the m-th word line driving signals WLEN0~WLENm, and sequentially accessed according to addresses.

The operation of the semiconductor memory device having the conventional self-refresh control circuit will now be described with reference to the accompanying drawings.

As depicted in a first section T1 of FIG. 2, when the first word line GWL0 is selected by an address, the first to n-th banks BANK0~BANKn are sequentially accessed, and thus carry out a refresh operation. In a second section T2, the second word line GWL1 is selected according to a next address. Again, the first to n-th banks BANK0~BANKn are sequentially accessed, and perform the refresh operation. The above operation is repeatedly carried out until the n-th word line GWLn is selected, thus refreshing the data stored in the memory cells of all the banks.

Here, the word line driving signals WLEN0~WLGNm are signals determining which sub-word line among the plurality of sub-word lines connected to the selected global word line is selected.

Accordingly, in the memory cells of the semiconductor memory device, the first to n-th banks BANK0~BANKn are sequentially accessed to a single global word line. When the n-th bank BANKn is finally accessed, the first to n-th banks BANK0~BANKn are sequentially accessed to a next global word line. As a result, the data of the memory cells of the semiconductor memory device are all refreshed.

However, the semiconductor memory device having a structure of the plurality of banks as described above has a disadvantage in that a high voltage and a high voltage word line driving signal must be applied to each bank during the self-refresh operation, which results in excessive power consumption.

SUMMARY OF THE INVENTION

It is therefore an object of the present invention to provide a semiconductor memory device having a self-refresh control circuit which can reduce power consumption by charge-sharing a high voltage word line driving signal of a bank which is being refreshed, with a next bank.

In order to achieve the above-described object of the present invention, there is provided a semiconductor memory device having a self-refresh control circuit, consisting of a plurality of banks receiving word line driving signals and connected with a plurality of global word lines, a high voltage word line driving signal applied to the bank which is being refreshed being charge-shared with the bank to be succeedingly refreshed by a MOS transistor switched according to a control signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1:
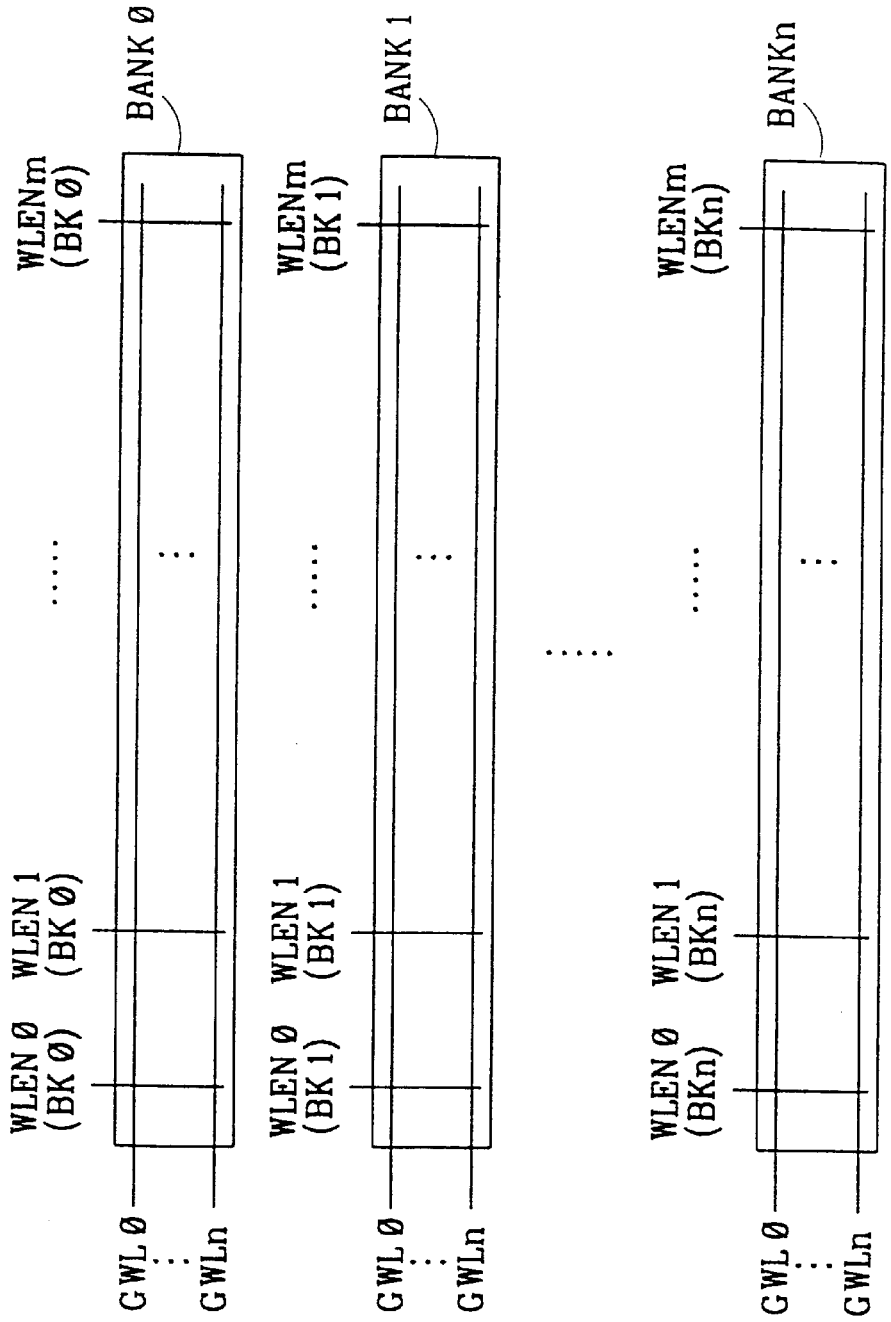
FIG. 1 is a block diagram illustrating a semiconductor memory device having a conventional self-refresh control circuit.
Figure 2:
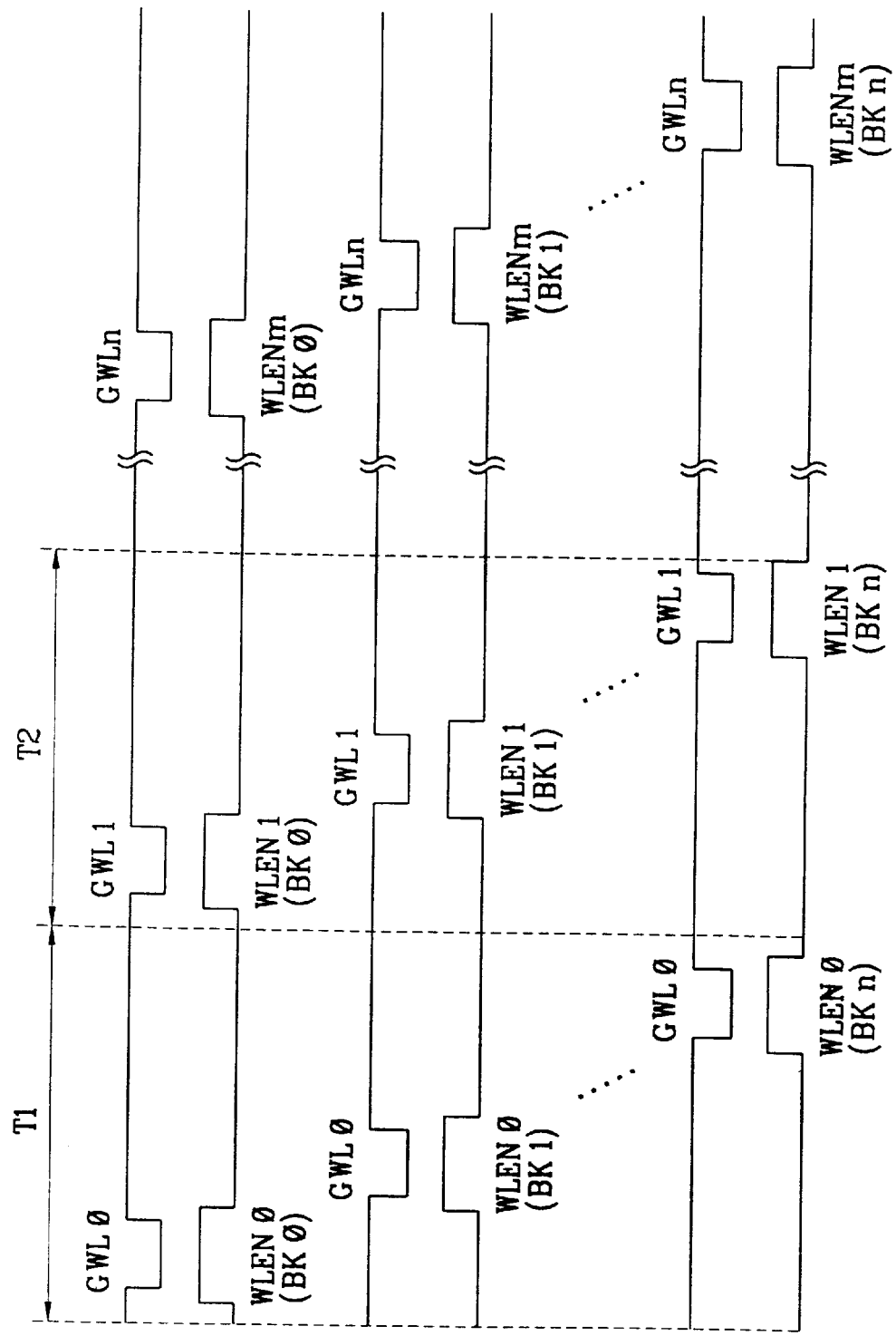
FIG. 2 is a waveform diagram of input signals in configuration of FIG. 1.
Figure 3:
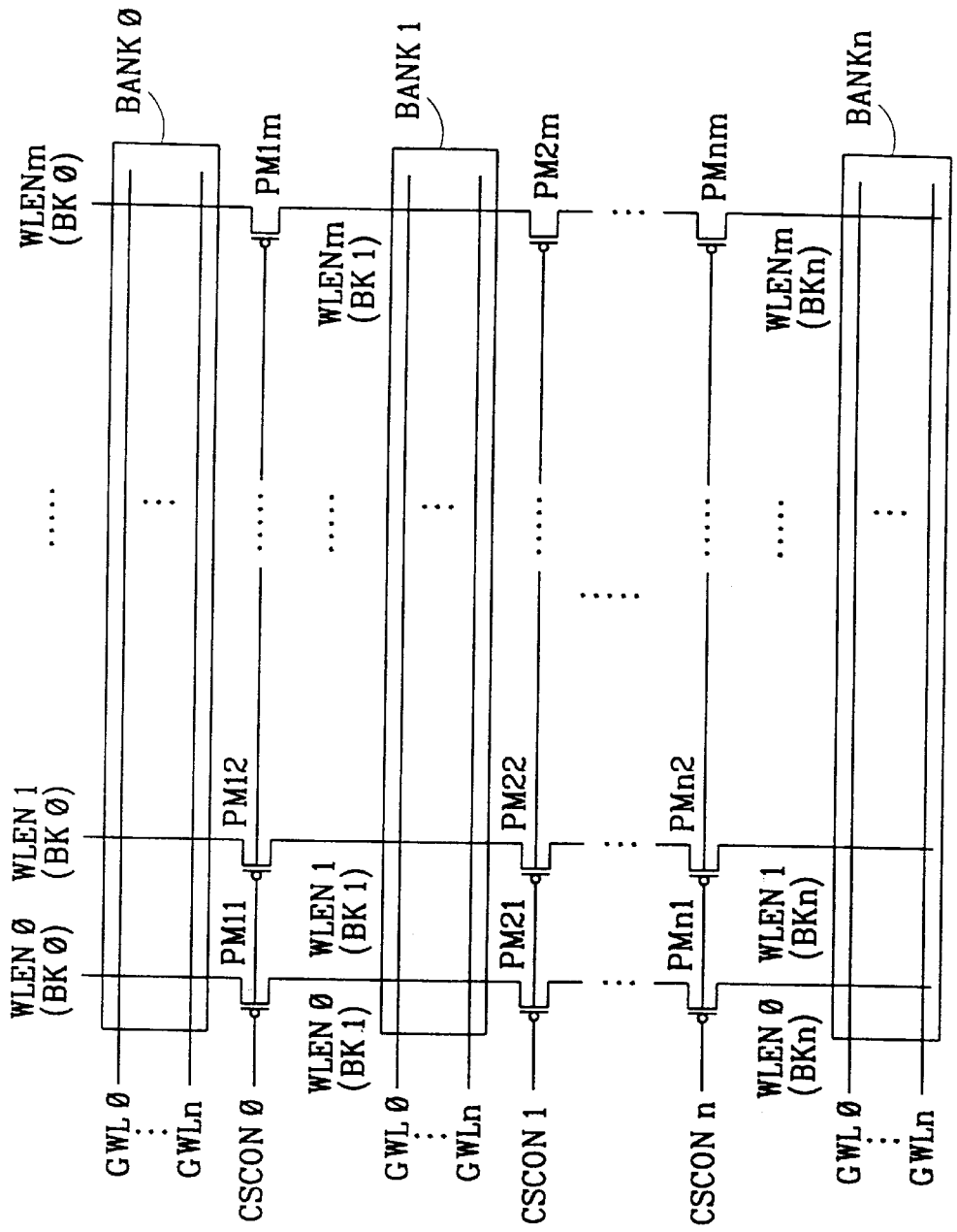
FIG. 3 is a block diagram illustrating a semiconductor memory device having a self-refresh control circuit in accordance with the present invention.

FIG. 3 is a block diagram illustrating a semiconductor memory device having a self-refresh control circuit in accordance with the present invention. Referring to FIG. 3, the semiconductor memory device having the self-refresh control circuit includes: a first to the n-th banks BANK0~BANKn receiving a first to the m-th word line driving signals WLEN0~WLENm, sequentially accessed according to addresses, and connected with first to n-th global word lines GWL0~GWLn; and an eleventh to the nm-th PMOS transistors PM11~PMnm switched according to control signals CSCON0~CSCONn in order to charge-share the high voltage word line driving signal applied to the bank which is being refreshed, with the bank which is succeedingly refreshed, the eleventh to nm-th PMOS transistors being connected between the banks.

The operation of the semiconductor memory device having the self-refresh control circuit will now be described in detail with reference to the accompanying drawings.

Figure 4:
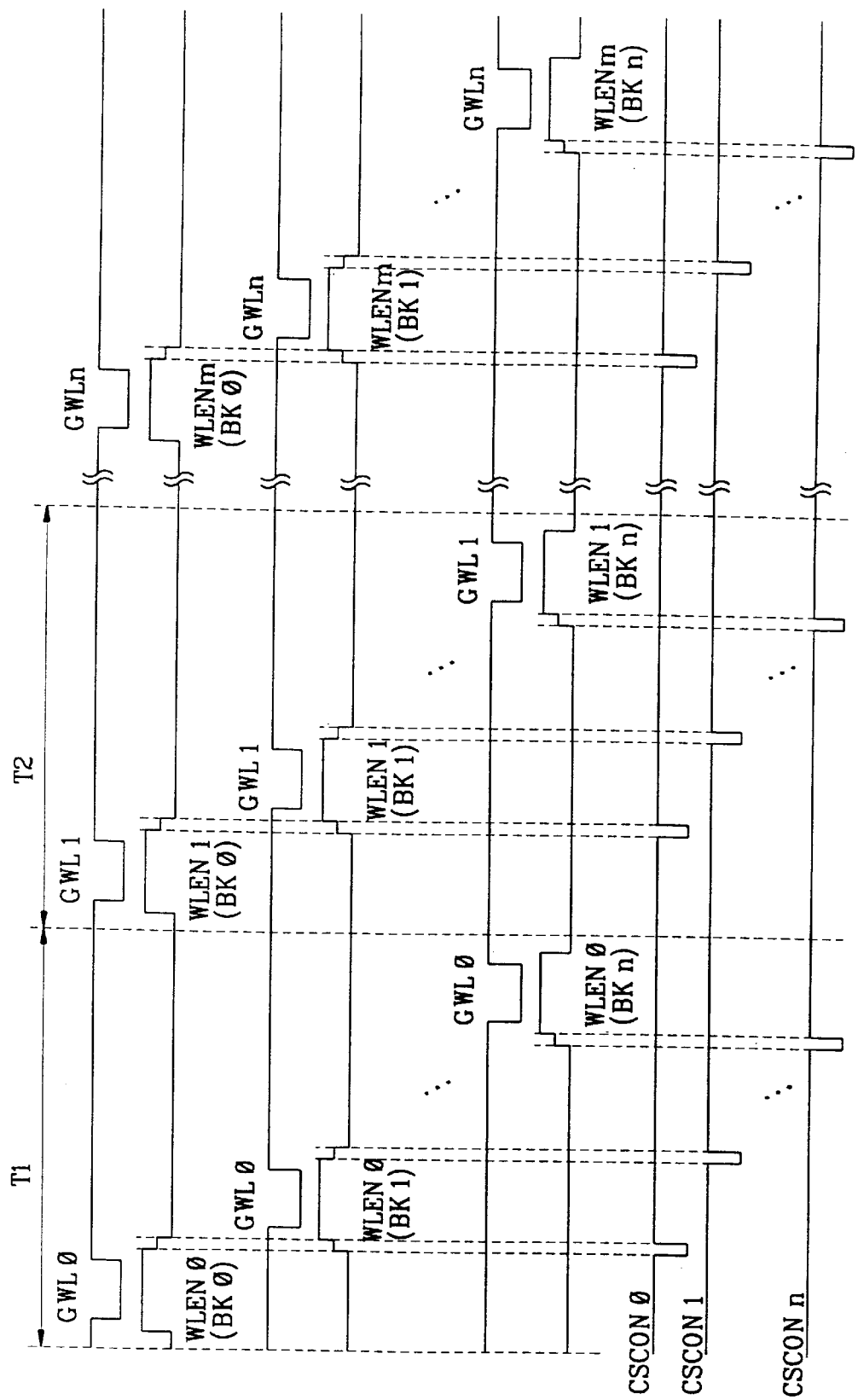
FIG. 4 is a waveform diagram of input signals in configuration of FIG. 3.

As shown in a first section T1 of FIG. 4, when the first word line GWL0 is selected according to an address, the first word line driving signal WLEN0 combined with a bank selecting signal is transited to a high potential, and thus the first to n-th banks BANK0~BANKn are sequentially accessed. Here, before the first word line driving signal WLEN0 is transited to a low potential, the eleventh to nm-th PMOS transistors PM11~PMnm are turned on by the first control signal CSCONO0 as shown in FIG. 4, and thus the first bank BANK0 and the second bank BANK1 share the first word line driving signal WLEN0. Accordingly, the first word line driving signal WLDEN0 at the high potential is charge-shared at an intermediate voltage to the first bank BANK0 and the second bank BANK1.

Thereafter, in a second section T2, the second word line GWL1 is selected according to a next address, the second word line driving signal WLEN1 combined to the bank selecting signal is transited to a high potential, and thus the first to n-th banks BANK0~BANKn are sequentially accessed. Here, as the first and second banks BANK0, BANK1 charge-share the intermediate voltage of the first word line driving signal WLEN0, the intermediate voltage is transited to a driving voltage, thereby sequentially accessing the first to n-th banks BANK0~BANKn again. This operation is repeatedly performed until the n-th word line GWLn is selected, and thus the data in all the memory cells are refreshed.

Here, the first to m-th word line driving signals WLEN0~WLENm are signals determining which sub-word line among the plurality of sub-word lines connected to the selected global word line is selected.

Accordingly, in the memory cells of the semiconductor memory device, the first to n-th banks BANK0~BANKn are sequentially accessed to one global word line. When the n-th bank BANKn is finally accessed, the first to n-th banks BANK0~BANKn are sequentially accessed to a next global word line. As a result, the data of every memory cell in the semiconductor memory device are refreshed.

As discussed earlier, the semiconductor memory device having the self-refresh control circuit can considerably reduce power consumption by charge-sharing the high voltage word line driving signals individually applied to the plurality of banks, with the bank to be succeedingly refreshed.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A semiconductor memory device having a self-refresh control circuit, comprising a plurality of banks receiving word line driving signals and connected with a plurality of global word lines, a high voltage word line driving signal applied to the bank which is being refreshed being charge-shared with the bank to be succeedingly refreshed by a switching unit.

2. The device according to claim 1, wherein the switching unit is a MOS transistor.

3. The device according to claim 1, wherein a switching operation of the switching unit is controlled according to a control signal.

* * * * *